United States Patent
Koldiaev et al.

(10) Patent No.: US 10,613,131 B2
(45) Date of Patent: Apr. 7, 2020

(54) PUMP AND PROBE TYPE SECOND HARMONIC GENERATION METROLOGY

(71) Applicant: FemtoMetrix, Inc., Irvine, CA (US)

(72) Inventors: Viktor Koldiaev, Morgan Hill, CA (US); Marc Kryger, Fountain Valley, CA (US); John Changala, Tustin, CA (US)

(73) Assignee: FemtoMetrix, Inc., Irvine, CA (US)

( * ) Notice: Subject to any disclaimer, the term of this patent is extended or adjusted under 35 U.S.C. 154(b) by 0 days.

(21) Appl. No.: 15/882,433

(22) Filed: Jan. 29, 2018

(65) Prior Publication Data

US 2018/0299497 A1    Oct. 18, 2018

Related U.S. Application Data (63) Continuation of application No. 14/690,179, filed on Apr. 17, 2015, now abandoned.

(Continued)

(51) Int. Cl.
*G01R 29/24* (2006.01)
*G01N 21/88* (2006.01)
(Continued)

(52) U.S. Cl.
CPC ........... *G01R 29/24* (2013.01); *G01N 21/636* (2013.01); *G01N 21/8806* (2013.01); *G01N 21/94* (2013.01); *G01N 21/9501* (2013.01); *G01N 27/00* (2013.01); *G01R 31/2601* (2013.01); *G01R 31/2656* (2013.01); *G01R 31/2831* (2013.01); *G01R 31/308* (2013.01); *H01L 22/12* (2013.01); *G01N 2201/06113* (2013.01)

(58) Field of Classification Search
CPC ................ G01R 29/24; G01R 31/2601; G01R 31/2656; G01N 21/636; G01N 21/8806; G01N 21/94; G01N 21/9501; G01N 27/00; G01N 2201/06113; H01L 22/12
See application file for complete search history.

(56) References Cited

U.S. PATENT DOCUMENTS 3,850,508 A    11/1974  Sittig et al.
4,286,215 A    8/1981   Miller
(Continued)

FOREIGN PATENT DOCUMENTS

EP    0 378 061    7/1990
EP    0 710 848    5/1996
(Continued)

OTHER PUBLICATIONS

Schaller et al. "Time-Resolved Second Harmonic Generation Near-Field Scanning Optical Microscopy", CHEMPHYSCHEM 2003, 4, pp. 1243-1247 (Year: 2003).*

(Continued)

*Primary Examiner* — Hina F Ayub
(74) *Attorney, Agent, or Firm* — Knobbe, Martens, Olson & Bear, LLP (57) ABSTRACT

Various approaches to can be used to interrogate a surface such as a surface of a layered semiconductor structure on a semiconductor wafer. Certain approaches employ Second Harmonic Generation and in some cases may utilize pump and probe radiation. Other approaches involve determining current flow from a sample illuminated with radiation.

22 Claims, 4 Drawing Sheets

Related U.S. Application Data (60) Provisional application No. 61/980,860, filed on Apr. 17, 2014.

(51) Int. Cl.
*G01N 21/95* (2006.01)
*G01N 21/94* (2006.01)
*G01R 31/265* (2006.01)
*G01R 31/26* (2020.01)
*G01N 27/00* (2006.01)
*H01L 21/66* (2006.01)
*G01N 21/63* (2006.01)
*G01R 31/308* (2006.01)
*G01R 31/28* (2006.01)

(56) References Cited

U.S. PATENT DOCUMENTS

| | | | |
|---|---|---|---|
| 4,291,961 | A | 9/1981 | Takayama |
| 5,294,289 | A | 3/1994 | Heinz et al. |
| 5,557,409 | A | 9/1996 | Downer et al. |
| 5,814,820 | A | 9/1998 | Dong et al. |
| 6,147,799 | A | 11/2000 | MacDonald |
| 6,321,601 | B1 | 11/2001 | Maris |
| 6,356,377 | B1 | 3/2002 | Bishop et al. |
| 6,650,800 | B2 | 11/2003 | Litvin |
| 6,795,175 | B2 | 2/2004 | Hunt |
| 6,751,374 | B2 | 6/2004 | Wu et al. |
| 6,781,686 | B2 | 8/2004 | Hunt |
| 6,788,405 | B2 | 9/2004 | Hunt |
| 6,791,099 | B2 | 9/2004 | Some et al. |
| 6,819,844 | B2 | 11/2004 | Hunt |
| 6,856,159 | B1 * | 2/2005 | Tolk .............. G01R 31/311 324/754.23 |
| 6,882,414 | B2 | 4/2005 | Hunt |
| 6,898,359 | B2 | 5/2005 | Soljacic et al. |
| 6,900,894 | B2 | 5/2005 | McMillen et al. |
| 7,158,284 | B2 | 1/2007 | Alles et al. |
| 7,259,868 | B2 | 8/2007 | Ozcan et al. |
| 7,304,305 | B2 | 12/2007 | Hunt |
| 7,324,267 | B2 | 1/2008 | Melloni et al. |
| 7,355,618 | B2 | 4/2008 | Seto et al. |
| 7,433,056 | B1 | 10/2008 | Janik |
| 7,580,138 | B2 | 8/2009 | Price |
| 7,592,828 | B2 | 9/2009 | Song |
| 7,595,204 | B2 | 9/2009 | Price |
| 7,616,307 | B2 | 11/2009 | Murtagh et al. |
| 7,659,979 | B2 | 2/2010 | Murtagh et al. |
| 7,684,047 | B2 | 3/2010 | Drake et al. |
| 7,718,969 | B2 | 5/2010 | Zhang et al. |
| 7,781,739 | B1 | 8/2010 | Jannson et al. |
| 7,830,527 | B2 | 11/2010 | Chen |
| 7,893,703 | B2 | 2/2011 | Rzepiela et al. |
| 7,894,126 | B2 | 2/2011 | Gunter et al. |
| 7,982,944 | B2 | 7/2011 | Kippenberg et al. |
| 8,049,304 | B2 | 11/2011 | Srividya et al. |
| 8,143,660 | B2 | 3/2012 | Lee et al. |
| 8,525,287 | B2 | 9/2013 | Tian et al. |
| 8,573,785 | B2 | 11/2013 | Kuksenkov et al. |
| 8,693,301 | B2 | 4/2014 | Knittel et al. |
| 8,755,044 | B2 | 6/2014 | Reich et al. |
| 9,018,968 | B2 | 4/2015 | Huang et al. |
| 9,194,908 | B2 | 11/2015 | Heidmann |
| 9,285,338 | B2 | 3/2016 | Dickerson et al. |
| 9,652,729 | B2 | 5/2017 | Hoffman, Jr. et al. |
| 9,759,656 | B2 | 9/2017 | Ito et al. |
| 10,371,668 | B2 | 8/2019 | Garnett et al. |
| 2003/0148391 | A1 | 8/2003 | Salafsky |
| 2005/0058165 | A1 * | 3/2005 | Morehead ............ H01S 3/08 372/39 |
| 2006/0092500 | A1 * | 5/2006 | Melloni ............ G02F 1/3534 359/330 |
| 2010/0208757 | A1 | 8/2010 | Hu |
| 2010/0272134 | A1 | 10/2010 | Blanding et al. |
| 2011/0125458 | A1 | 5/2011 | Xu et al. |
| 2013/0003070 | A1 | 1/2013 | Sezaki et al. |
| 2015/0330908 | A1 | 11/2015 | Koldiaev et al. |
| 2015/0330909 | A1 | 11/2015 | Koldiaev et al. |
| 2015/0331029 | A1 | 11/2015 | Koldiaev et al. |
| 2015/0331035 | A1 | 11/2015 | Koldiaev et al. |
| 2015/0331036 | A1 | 11/2015 | Koldiaev et al. |
| 2016/0131594 | A1 | 5/2016 | Koldiaev et al. |
| 2017/0067830 | A1 | 3/2017 | Adell et al. |
| 2018/0217192 | A1 | 8/2018 | Koldiaev et al. |
| 2018/0217193 | A1 | 8/2018 | Koldiaev et al. |
| 2018/0292441 | A1 | 10/2018 | Koldiaev et al. |

FOREIGN PATENT DOCUMENTS

| | | |
|---|---|---|
| JP | 2004-226224 | 8/2004 |
| JP | 2008-218957 | 9/2008 |
| TW | 200421460 | 10/2004 |
| TW | 201723467 | 7/2017 |
| WO | WO 00/55885 | 9/2000 |
| WO | WO 02/065108 | 8/2002 |
| WO | WO 2015/161136 | 10/2015 |
| WO | WO 2016/077617 | 5/2016 |
| WO | WO 2017/041049 | 3/2017 |

OTHER PUBLICATIONS

"Rapid Non-destructive Characterization of Trap Densities and Layer Thicknesses in HfO2 Gate Materials Using Optical Second Harmonic Generation", Semicon Korea, Santa Ana, California, Jan. 2016, in 24 pages.

Adell, P. C. et al., "Impact of Hydrogen Contamination on the Total Dose Response of Linear Bipolar Micocircuits", IEEE, Aug. 2007, in 8 pages.

Alles, M. et al, "Second Harmonic Generation for Noninvasive Metrology of Silicon-on-Insulators Wafers", IEEE Transactions on Semiconductor Manufacturing, vol. 20(2), May 2007, pp. 107-113, in 7 pages.

An, Y. et al., "Role of photo-assisted tunneling in time-dependent second-harmonic generation from Si surfaces with ultrathin oxides", Applied Physics Letters, vol. 102, Feb. 4, 2013, pp. 051602-051602-4, in 5 pages.

Bierwagen, O. et al., "Dissipation-factor-based criterion for the validity of carrier-type identification by capacitance-voltage measurements", Applied Physics Letters, vol. 94, Apr. 2009, pp. 152110-152110-3, in 3 pages.

Bloch, J. et al., "Electron Photoinjection from Silicon to Ultrathin SiO2 Films via Ambient Oxygen", Physical Review Letters vol. 77(5), Jul. 29, 1996, pp. 920-923, in 4 pages.

Campagnola, P., "Second Harmonic Generation Imaging Microscopy: Applications to Diseases Diagnostics", Analytical Chemistry, May 2011, pp. 3224-3231, in 16 pages.

Chang, C. L. et al., "Direct determination of flat-band voltage for metal/high κ oxide/semiconductor heterointerfaces by electric-field-induced second-harmonic generation", Applied Physics Letters vol. 98, Apr. 2011, pp. 171902-171902-3, in 3 pages.

Dautrich, M. et al., "Noninvasive nature of corona charging on thermal Si/SiO2 structures", Applied Physics Letters, vol. 85(10), Sep. 6, 2004, pp. 1844-1845, in 2 pages.

De Vries, J. et al., "Measuring the concentration and energy distribution of interface states using a non-contact corona oxide semicondcutor method", Applied Physics Letters, vol. 100, Feb. 24, 2012, pp. 082111-082111-3, in 3 pages.

Dixit, S. K. et al., "Radiation Induced Charge Trapping in Ultrathin HfO2-Based MOSFETs", IEEE Transactions on Nuclear Science, vol. 54(6), Dec. 2007, pp. 1883-1890, in 8 pages.

Erley, G. et al., "Silicon interband transitions observed at Si(100)-SiO2 interfaces", Physical Review B, vol. 58(4), Jul. 15, 1998, pp. R1734-R1737, in 4 pages.

Esqueda, I. et al., "Modeling the Effects of Hydrogen on the Mechanisms of Dose Rate Sensitivity", RADECS 2011 Proceedings—A-1, Sep. 2011, pp. 1-6, in 6 pages.

(56) References Cited

OTHER PUBLICATIONS

Fomenko, V. et al., "Optical second harmonic generation studies of ultrathin high-k dielectric stacks", Journal of Applied Physics, American Institute of Physics, vol. 97(8), Apr. 11, 2005, in 8 pages.
Fomenko, V. et al., "Second harmonic generation investigations of charge transfer at chemically-modified semiconductor interfaces", Journal of Applied Physics, vol. 91(7), Apr. 1, 2002, pp. 4394-4398, in 5 pages.
Geiger, F., "Second Harmonic Generation, Sum Frequency Generation and X(3): Dissecting Environmental Interfaces with a Nonlinear Optical Swiss Army Knife", Annual Review of Physical Chemistry, vol. 60(1), Nov. 2008, pp. 61-83, in 25 pages.
Gielis, J. J. H. et al., "Negative charge and charging dynamics in Al2O3 films on Si characterized by second-harmonic generation", Journal of Applied Physics, American Institute of Physics, vol. 104(7), Nov. 2008, pp. 073701-073701-5, in 6 pages.
Gielis, J. J. H. et al., "Optical second-harmonic generation in thin film systems", Journal of Vacuum Science Technology A, vol. 26(6), Nov./Dec. 2008, pp. 1519-1537, in 20 pages.
Glinka, Y. D. et al., "Ultrafast dynamics of interfacial electric fields in semiconductor heterostructures monitored by pump-probe second-harmonic generation", Applied Physics Letter, vol. 81(20), Nov. 11, 2002, pp. 3717-3719, in 3 pages.
Heinz, T. F. et al., "Optical Second-Harmonic Generation from Semiconductor Surfaces", Advances in Laser Science III, edited by A. C. Tam, J. L. Cole and W. C. Stwalley (American Institute of Physics, New York, 1988) p. 452, in 8 pages.
Istratov, A. et al., "Exponential analysis in physical phenomena", Review of Scientific Instruments, vol. 70(2), , Feb. 1999, pp. 1233-1257, in 25 pages.
Jiang, Y. et al., "Finite difference method for analyzing band structure in semiconductor heterostructures without spurious solutions", Journal of Applied Physics, vol. 116(17), Nov. 2014, pp. 173702-173702-9, in 10 pages.
Jozwikowska, A., "Numerical solution of the nonlinear Poisson equation for semiconductor devices by application of a diffusion-equation finite difference scheme", Journal of Applied Physics, vol. 104, Oct. 2008, pp. 063715-1 to 063715-9, in 10 pages.
Jun, H. et al., "Charge Trapping in Irradiated SOI Wafers Measured by Second Harmonic Generation", IEEE Transactions on Nuclear Science, vol. 51(6), Dec. 2004, pp. 3231-3237, in 8 pages.
Kang, A. Y. et al., "The Radiation Response of the High Dielectric-Constant Hafnium Oxid/Silicon System", IEEE Transactions on Nuclear Science, vol. 49(6), Dec. 2002, pp. 2636-2642, in 7 pages.
Katsube, T. et al., "Memory Traps in MNOS Diodes Measured by Thermally Stimulated Current", Solid State Electronics, vol. 19(1), Jan. 1976, pp. 11-16, in 6 pages.
Koldyaev, V. et al., "Rapid Non-Destructive Detection of Sub-Surface Cu in Silicon-On-Insulator Wafers by Optical Second Harmonic Generation", ASMC, May 2015, in 4 pages.
Lantz, J. et al., "Time-Resolved Optical Second Harmonic Generation Measurements of Picosecond Band Flattening Processes at Single Crystal TiO2 Electrodes", The Journal of Physical Chemistry, vol. 98(38), Sep. 1994, pp. 9387-9390, in 4 pages.
Lei, M. et al., "Hot carrier injection from nanometer-thick silicon-on-insulator films measured by optical second harmonic generation", Applied Physics Letters, vol. 96, Jul. 2010, pp. 241105-241105-3, in 3 pages.
Lundstrom, I. et al., "Tunneling to traps in insulators", Journal of Applied Physics, vol. 43(12), Dec. 1972, pp. 5045-5047, in 4 pages.
Lupke, G. et al., "Electron Trapping in Ultrathin SiO2 on Si(001) Probed by Electric-Field-Induced Second-Harmonic Generation", IEEE Nonlinear Optics: Materials, Fundamentals and Applications—Conference Proceedings, MC22, Aug. 1998, pp. 89-91, in 3 pages.
Mandoc, M. M. et al., "Corona Charging and Optical Second-Harmonic Generation Studies of the Field-Effect Passivation of c-SI by Al2O3 Films", IEEE, Jul. 2010, in 5 pages.
Marano, S. et al., "Sequential Detection of Almost-Harmonic Signals", IEEE Transactions on Signal Processing, vol. 51(2), Feb. 2003, pp. 395-406, in 12 pages.
Marka, Z. et al., "Band offsets measured by internal photo-emission-induced second-harmonic generation", Physical Review B, vol. 67(4), Jan. 2003, pp. 045302-045302-5, in 6 pages.
Marka, Z. et al., "Band offsets measurement of Si-SiO2 interfaces by internal photoemission induced second-harmonic generation", Physical Review Journal, paper QTuM6, 2003, in 2 pages.
Marka, Z. et al., "Characterization of X-Ray Radiation Damage in Si/SiO2 Structures Using Second-Harmonic Generation", IEEE Transactions on Nuclear Science, vol. 47(6), Dec. 2000, pp. 2256-2261, in 6 pages.
Marka, Z. et al., "Two-color optical technique for characterization of x-ray radiation-enhanced electron transport in SiO2", Journal of Applied Physics, vol. 93(4), Feb. 15, 2003, pp. 1865-1870, in 6 pages.
Mihaychuk, J. G. et al, "Time-dependent second-harmonic generation from the Si-SiO2 interface induced by charge transfer", Optics Letters, vol. 20(20), Oct. 1995, pp. 2063-2065, in 4 pages.
Murzina, T. et al., "Optical Second Harmonic Generation in Semiconductor Nanostructures", Physics Research International, vol. 2012, Mar. 16, 2012, in 12 pages.
Nagel, J. et al., "Solving the Generalized Poisson Equation Using the Finite-Difference Method (FDM)", Feb. 15, 2012, pp. 1-18, in 18 pages.
Neethling, P. H. et al., "Second harmonic generation as a technique to probe buried interfaces", South African Journal of Science, vol. 105, Jul./Aug. 2009, pp. 282-284, in 3 pages.
Park, H. et al., "Total Ionizing Dose Effects on Strained HfO2-Based nMOSFETs", IEEE Transactions on Nuclear Science, vol. 55(6), Dec. 2008, pp. 2981-2985, in 5 pages.
Pasternak, R. et al., "Laser detection of radiation enhanced electron transport in ultra-thin oxides", Nuclear Instruments and Methods in Physics Research A, vol. 514, 2003, pp. 150-155, in 6 pages.
Pedersen, K. et al., "Spectroscopic second-harmonic generation from silicon-on-insulator wafers", Optical Society of America, vol. 26(5), May 2009, pp. 917-922, in 6 pages.
Powell, R. D., "The Use of Photoinjection to Determine Oxide Charge Distributions and Interface Properties in MOS Structures", IEEE Transactions on Nuclear Sciences, vol. 17(6), Jan. 1971, pp. 41-46, in 6 pages.
Price, J. et al., "Charge trapping defects in Si/SiO2/Hf(1-x)SixO2 film stacks characterized by spectroscopic second-harmonic generation", Journal of Vacuum Science and Technology: Part B, AVS/SIP, vol. 29(4), Jul. 2011, pp. 4D101-4D101-11, in 12 pages.
Price, J. et al., "Optical second-harmonic generation study of charge trapping dynamics in HfO2/SiO2 films on Si(100)", Physica Status Solidi, vol. 5(8), Jun. 2008, pp. 2667-2670, in 4 pages.
Rai, V. N. et al., "A transistorized Marx bank circuit providing sub-nanosecond high-voltage pulses", Measurement Science and Technology, vol. 5(4), Nov. 1993, pp. 447-449, in 3 pages.
Reber, R. et al., "Thermally stimulated current measurements of SiO2 defect density and energy in irradiated metal-oxide-semiconductor capacitors", Review of Scientific Instruments, vol. 63(12), Jun. 4, 1998, pp. 5714-5725, in 13 pages.
Robertson, J., "Band offsets of wide-band-gap oxides and implications for future electronic devices", Journal of Vacuum Science and Technology B, vol. 18(3), May 2000, pp. 1785-1791, in 7 pages.
Shaver, J. et al., "A 2D Finite Difference Simulation to Investigate the High Voltage Blocking Characteristics of 4H-SiC Photoconductive Semiconductor Switches", IEEE, 978-1-4799-8403-9/15, May 2015, pp. 193-195, in 3 pages.
Taguchi, D. et al., "Probing of carrier behavior in organic electroluminescent diode using electric field induced optical second-harmonic generation measurement", Applied Physics Letters, vol. 95, Dec. 30, 2009, pp. 263310-263310-3, in 4 pages.
Ushiki, T. et al., "Evidence of Energetically-Localized Trap-States at SOI-BOX Interface in High-Dose SIMOX Wafers", IEEE International SOI Conference, Oct. 1999, pp. 48-49, in 2 pages.
Vanbel, M. K. et al., "Electric-Field-Induced Second-Harmonic Generation Demonstrates Different Interface Properties of Molecular Beam Epitaxy Grown MgO on Si", The Journal of Physical Chemistry, vol. 118(4), Jan. 2014, in 6 pages.

(56) References Cited

OTHER PUBLICATIONS

Vanbel, M. K. et al., "Tunneling of holes is observed by second-harmonic generation", Applied Physics Letters, vol. 102(8), Feb. 2013, in 5 pages.
Vasudevan, V. et al., "A numerical simulation of hole and electron trapping due to radiation in silicon dioxide", Journal of Applied Physics, vol. 70, Nov. 1991, pp. 4490-4495, in 7 pages.
Wang, H. et al., "Non-degenerate fs pump-probe study on InGaN with multi-wavelength second-harmonic generation", Optics Express, Jul. 11, 2005, vol. 13(14), pp. 5245-5252, in 8 pages.
Wang, W. et al., "Coupled Electron-Hole Dynamics at the Si/SiO2 Interface", Physical Review Letters, vol. 81(19), Nov. 9, 1998, pp. 4224-4227, in 4 pages.
White, Y. V. et al., "Studies of charge carrier trapping and recombination processes in Si SiO2 MgO structures using second-harmonic generation", Applied Physics Letters, vol. 88, Feb. 2006, pp. 062102-062102-3, in 3 pages.
Xiao, D. et al., "Optical probing of a silicon integrated circuit using electric-field-induced second-harmonic generation", Applied Physics Letters, vol. 88, Mar. 17, 2006, pp. 114107-114107-3, in 4 pages.
European Extended Search Report dated Feb. 26, 2019 in corresponding EP Application No. 16843152.6.
European Extended Search Report dated Sep. 28, 2017 in corresponding EP Application No. 15779557.6.
European Extended Search Report dated Apr. 3, 2018 in corresponding EP Application No. 15858539.8.
European Office Action dated Aug. 30, 2019 in corresponding EP Application No. 15858539.8.
International Search Report and Written Opinion dated Dec. 21, 2016 in corresponding PCT Application No. PCT/US2016/050286.
International Preliminary Report on Patentability and Written Opinion dated Mar. 6, 2018 in corresponding PCT Application No. PCT/US2016/050286.
Invitation to Pay Addition Fees and Partial Search Report dated Jul. 27, 2015 in corresponding PCT Application No. PCT/US2015/026263.
International Search Report and Written Opinion dated Sep. 23, 2015 in corresponding PCT Application No. PCT/US2015/026263.
International Preliminary Report on Patentability and Written Opinion dated Oct. 27, 2016 in corresponding PCT Application No. PCT/US2015/026263.
International Search Report and Written Option dated Feb. 26, 2016 in corresponding PCT Application No. PCT/US2015/060437.
International Preliminary Report on Patentability and Written Opinion dated May 26, 2017 in corresponding PCT Application No. PCT/US2015/060437.
International Search Report and Written Option dated Aug. 13, 2019 in corresponding PCT Application No. PCT/US2019/029485.
International Search Report and Written Opinion dated Sep. 25, 2019 in corresponding PCT Application No. PCT/US2019/032282.
International Search Report and Written Option dated Aug. 8, 2019 in corresponding PCT Application No. PCT/US2019/029439.
Taiwanese Office Action dated Sep. 28, 2017 in corresponding TW Application No. 105131588.
U.S. Office Action dated Jul. 13, 2018 in corresponding U.S. Appl. No. 15/256,442.
U.S. Office Action dated Apr. 4, 2019 in corresponding U.S. Appl. No. 15/256,442.
U.S. Office Action dated Jul. 26, 2019 in corresponding U.S. Appl. No. 15/256,442.
U.S. Office Action dated Feb. 8, 2017 in corresponding U.S. Appl. No. 14/690,179.
U.S. Office Action dated Aug. 28, 2017 in corresponding U.S. Appl. No. 14/690,179.
U.S. Office Action dated Oct. 13, 2016 in corresponding U.S. Appl. No. 14/690,256.
U.S. Office Action dated Jul. 28, 2017 in corresponding U.S. Appl. No. 14/690,256.
U.S. Office Action dated Oct. 31, 2018 in corresponding U.S. Appl. No. 15/880,308.
U.S. Office Action dated May 1, 2017 in corresponding U.S. Appl. No. 14/690,251.
U.S. Office Action dated Jun. 25, 2018 in corresponding U.S. Appl. No. 15/799,594.
U.S. Office Action dated Apr. 17, 2019 in corresponding U.S. Appl. No. 15/799,594.
U.S. Office Action dated Sep. 5, 2019 in corresponding U.S. Appl. No. 15/799,594.
U.S. Office Action dated Oct. 7, 2016 in corresponding U.S. Appl. No. 14/690,279.
U.S. Office Action dated May 8, 2017 in corresponding U.S. Appl. No. 14/690,279.
U.S. Office Action dated Sep. 18, 2018 in corresponding U.S. Appl. No. 15/806,271.
U.S. Office Action dated Mar. 29, 2019 in corresponding U.S. Appl. No. 15/806,271.
U.S. Office Action dated Feb. 5, 2018 in corresponding U.S. Appl. No. 14/939,750.
U.S. Office Action dated Jun. 26, 2018 in corresponding U.S. Appl. No. 14/939,750.
U.S. Office Action dated Feb. 13, 2019 in corresponding U.S. Appl. No. 14/939,750.
U.S. Office Action dated Sep. 24, 2019 in corresponding U.S. Appl. No. 14/939,750.

* cited by examiner

PUMP AND PROBE TYPE SECOND HARMONIC GENERATION METROLOGY

CROSS-REFERENCE TO RELATED APPLICATIONS

This application is a continuation of U.S. patent application Ser. No. 14/690,179, filed on Apr. 17, 2015, which is incorporated by reference herein in its entirety, which claims benefit under 35 U.S.C. § 119(e) of U.S. Provisional Application No. 61/980,860, filed on Apr. 17, 2014, titled "WAFER METROLOGY TECHNOLOGIES," which is incorporated by reference herein in its entirety, including but not limited to each of the Sections I, II, III, and IV, which are each incorporated herein by reference in their entirety.

FIELD

The subject filing relates to systems for Second Harmonic Generation (SHG) based wafer inspection, semiconductor metrology, materials characterization, surface characterization and/or interface analysis.

BACKGROUND

In nonlinear optics, light beam input(s) are output as the sum, difference or harmonic frequencies of the input(s). Second Harmonic Generation (SHG) is a non-linear effect in which light is emitted from a material at an angle with twice the frequency of an incident source light beam. The process may be considered as the combining of two photons of energy E to produce a single photon of energy 2E (i.e., the production of light of twice the frequency ($2\omega$) or half the wavelength) of the incident radiation.

A survey of scientific investigations in which the SHG technique has been employed is provided by, "Optical Second-Harmonic Generation from Semiconductor Surfaces" by T. F. Heinz et al., Published in Advances in Laser Science III, edited by A. C. Tam, J. L. Cole and W. C. Stwalley (American Institute of Physics, New York, 1988) p. 452. As reviewed, the SHG process does not occur within the bulk of materials exhibiting a center of symmetry (i.e., in inversion or centrosymmetric materials). For these materials, the SHG process is appreciable only at surfaces and/or interfaces where the inversion symmetry of the bulk material is broken. As such, the SHG process offers a unique sensitivity to surface and interface properties.

So-understood, the SHG effect is described in U.S. Pat. No. 5,294,289 to Heinz et al. Each of U.S. Pat. No. 5,557,409 to Downer, et al., U.S. Pat. Nos. 6,795,175; 6,781,686; 6,788,405; 6,819,844; 6,882,414 and 7,304,305 to Hunt, U.S. Pat. No. 6,856,159 to Tolk, et al. and U.S. Pat. No. 7,158,284 to Alles, et al. also describe other approaches or "tools" that may be employed. Yet, the teachings of these patents appear not to have overcome some of the main obstacles to the adoption of SHG as an established technique for use in semiconductor manufacturing and metrology.

SUMMARY

An SHG metrology tool is described in which electrons in a layered semiconductor substrate are excited, variously, by each of a pump light source and a probe light source having different power characteristics for the purpose of Sum Frequency Generation (SFG) (e.g., typically SHG). For such an approach, a metrology characterization tool is provided with an "additional" integrated light source (e.g., a UV flash lamp or laser) operating as a "pump" to induce a potential difference across heterointerface(s) in layered semiconductor device templates, together with a short or ultra-short pulsed laser (e.g., a femto-second solid state laser) operating as a "probe" light source. Utility is derived from using the two different sources for different purposes in concert or in conjunction with each other (via various time-offset and/or variable pump energy methods as further described) as distinguished from a single laser SHG or a dual or multiple laser SFG system.

In one method, the pump is employed as a pre-exciting or pre-excitation light source to allow for total characterization time of some materials to be reduced. In many such implementations, the time-dependent electric field is not primarily produced by the probe/probing laser. In one variation of this method, the pump is used to UV flash an entire wafer and then use the probe laser to raster or otherwise scan the entire wafer or some portion thereof spending minimum probe time per point (e.g., scanning as fast as hardware can move the laser). Options in this regard include row-by-row scanning with a step along the (scan) column by wafer shift. Another approach may employ wafer rotating and scanning along the radii.

In another variation, the pump allows a quick charge up of the material interface at a sample site, followed by observation of the decay of that charged interface with the probe in connection with fast-blocking and/or optical delay methods further described in in the portion of U.S. Provisional Application No. 61/980,860, filed on Apr. 17, 2014, titled "WAFER METROLOGY TECHNOLOGIES," referred to as Section II entitled, "CHARGE DECAY MEASUREMENT SYSTEMS AND METHODS," which is incorporated herein by reference in its entirety. See also co-pending U.S. patent application Ser. No. 14/690,256, filed Apr. 17, 2015 titled "CHARGE DECAY MEASUREMENT SYSTEMS AND METHODS", published as U.S. Publication No. 2015/0331029, which is incorporated herein by reference in its entirety. Regardless, in various embodiments, the intent of pump use for pre-excitation is to inject charge carriers into, e.g., the dielectric in a quantity sufficient to impact the interfaces.

In another method, the pump laser is employed as a post-exciting or post-excitation light source to affect an SHG signal already being produced by the probe laser at a sample site. Yet another method employs a compare/contrast of the SHG signal generated by the probe pre- and post-pump laser energy application. By probing the sample and measuring the SHG response prior to pumping, then applying radiation from the pump light source and after that, re-probing, the difference in the SHG response pre- and post-pump can be used to determine additional material properties, such as trap density in the material dielectric.

In various methods discussed herein, a timing differential (i.e., in terms of pre- and/or post-excitation by the pump source in relation to probe laser use) is employed to deliver interrogation curves evincing further information about the material interface.

In various methods, the pump and probe sources are used simultaneously, with the combination used to provide an SHG signal for determining threshold injection carrier energy. Specifically, while probing with the probe laser, a tunable pump laser is ramped-up in frequency. At a particular frequency, the SHG signal exhibits an inflection point (or a region of discontinuity). A value corresponding to the pump laser frequency at the inflection point (or the region of discontinuity) can be related to threshold injection carrier energy.

Various embodiments of the subject pump and probe system offers certain hardware-based advantage possibilities as well. In an example where the pump is a flash lamp, highly relevant cost savings can be achieved relative to 2-laser systems. Whether provided as a flash lamp or a second laser, the combination of a pump and probe as contemplated herein can also reduce the risk of optical damage to the substrate to be interrogated because illumination that is too powerful will degrade the dielectrics and even substrate if a threshold average power is exceeded. The threshold average power that causes optical damage to the substrate can be determined by experimental calibration study.

To understand the latter possibility in connection with the subject hardware some background is provided. Namely, both pump and probe energies, alone, are capable of producing an SHG signal with such hardware. While the pump and probe sources do not need to operate in conjunction to produce SHG signal, relevant material properties are derived in the subject methods primarily from the SHG intensity produced by the probe, as the pump will generally not have the peak power to drive buried interfacial SHG appropriately. Time-dependent SHG intensity curves will change based on the distribution of charge carriers across an interface, for example, between the dielectric and substrate. The time it takes for injection of carriers across an interface, for example, between the dielectric and a semiconductor substrate, is dependent upon the average power targeted on the sample. In some implementations, the probe alone can enable injection of carriers across an interface between the dielectric and substrate. In such implementations due to the inability to decouple average power from peak power, the time taken to reach the target average power that allows for injection of carriers across an interface between the dielectric and substrate without exceeding the optical damage threshold of a material may be greater than implementations using a combination of pump and probe. By using a high average power but low peak power optical source as a pump to inject carriers across an interface between the dielectric and substrate prior to probing, the time savings of increased average power can be had without the potential damage complications a high peak power at said average power may induce.

Accordingly, as compared to the pump, the subject probe is typically a higher peak power source with low average power. Stated otherwise, the probe laser is typically relatively very weak. In one aspect, this allows for minimal disturbance to the native electric field present at the substrate interface to yield an initial time-independent signal.

With higher average power but low peak power, the pump induces an electric field (E) by causing charge carriers to jump up in energy level at the material interface or across the interface. By using a relatively high average power source as the pump and quickly "charging up" the interface by giving all the available electrons the energy at least sufficient to jump into the dielectric, a situation is created where the high peak power (providing high SHG conversion rates) but low average power (due to short pulse duration and limited number of such pulses) probe laser can quickly interrogate the surface to provide time-independent SHG signal data.

Accordingly, in various embodiments described herein a reduction in the time required for a/the probe laser to move electrons to higher energy levels or across interfaces can be achieved which can allow for faster evaluations of a steady-state SHG signal and/or charge carrier time dynamics measurements. This approach also allows for separating the effects of the SHG probe from its own influence on the electric field at substrate interfaces. It also allows time-dependence in the SHG process to be sped up or ignored as well as allowing for faster acquisition of time-independent SHG data over at least part of an acquired signal from the probe beam. Likewise, another aspect allows for faster and/or more accurate determination of threshold energy for carrier injection into an interface (e.g., interface between a semiconductor and a dielectric), as well as fast(er) throughput in a line tool environment. Whatever the context, the available time reduction offered can advantageously facilitate high throughput testing in any sort of in-line metrology tool in the semiconductor industry. By way of example, to generate time dependence curves using pre-existing application of the SHG technique on a device including a 25 nm buried oxide layer under a 10 nm Silicon on Insulator (10 nm device layer/25 nm BOX SOI) takes 6 to 12+ seconds per point. Using pre-excitation as described herein, time dependence can be generated in under 1 second, pending material and pump/probe power. This advance would enable a 10×+ surface area covered on a wafer given available time/wafer on the line, or enable equivalent confidence in 10% of the time. And while these sort of numbers will vary based on material, layer thickness and specific pump/probe power and wavelength, they should be illuminating.

Invention embodiments hereof include each of the methodology associated with the approaches described above, hardware to carry out the methodology, productions systems incorporating the hardware and products (including products-by-process) thereof.

BRIEF DESCRIPTION OF THE DRAWINGS

The figures diagrammatically illustrate aspects of various embodiments of different inventive variations.

DETAILED DESCRIPTION

Figure 1A:
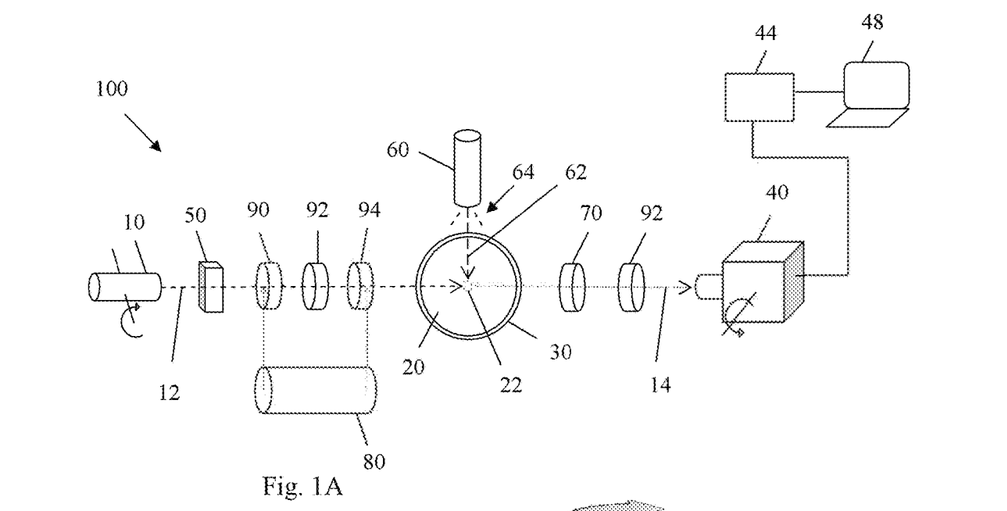
FIG. 1A is a diagram of an SHG metrology system embodiment hereof.

FIG. 1 is a diagram of a system 100 as may employed in connection with the subject methodology. Other suitable system variations are presented in the portion of U.S. Provisional Application No. 61/980,860, filed on Apr. 17, 2014, titled "WAFER METROLOGY TECHNOLOGIES," referred to as Section II entitled, "CHARGE DECAY MEASUREMENT SYSTEMS AND METHODS" for example, as to intermediate optics, the inclusion of optical delay line(s) and optional electrode features, which is incorporated herein by reference in its entirety. See also co-pending U.S. patent application Ser. No. 14/690,256, filed Apr. 17, 2015 titled "CHARGE DECAY MEASUREMENT SYSTEMS AND METHODS", published as U.S. Publication No. 2015/0331029, which is incorporated herein by reference in its entirety.

Figure 1B:
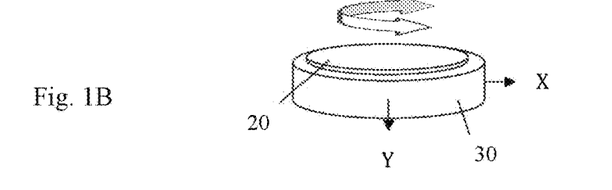
FIG. 1B is a perspective view of a chuck for use in such an SHG system.

As shown, system 100 includes a primary or probe laser 10 for directing an interrogation beam 12 of electro-magnetic radiation at a sample wafer 20, which is held by a vacuum chuck 30. As illustrated in FIG. 1B, the chuck 30 includes or is set on x-and y-stages and optionally also a rotational stage for positioning a sample site 22 across the wafer relative to where the laser(s) are aimed. The x-y stage enables scanning multiple wafer surface sites or locations 22 without movement of other hardware. A rotational stage optionally enables assessing crystal structure effects on SHG such as strain, and associated defects or areas of concern on materials being characterized. Further optional features, aspects and/or uses of chuck 30 are presented in portions of U.S. Provisional Application No. 61/980,860, filed on Apr. 17, 2014, titled "WAFER METROLOGY TECHNOLOGIES," referred to as Section IV titled, "FIELD-BIASED SHG METROLOGY," and Section III titled "TEMPERATURE-CONTROLLED METROLOGY," both which are incorporated herein by reference in their entirety. See also co-pending U.S. patent application Ser. No. 14/690,251, filed Apr. 17, 2015 titled "FIELD-BIASED SECOND HARMONIC GENERATION METROLOGY", published as U.S. Publication No. 2015/0331036, which is incorporated herein by reference in its entirety. The sample site 22 can include one or more layers. The sample site 22 can comprise a composite substrate including at least two layers. The sample site 22 can include an interface between two dissimilar materials (e.g., between two different semiconductor materials, between two differently doped semiconductor materials, between a semiconductor and an oxide, between a semiconductor and a dielectric material, between a semiconductor and a metal or an oxide and a metal).

When system 100 is in use, a beam 14 of reflected radiation directed at a detector 40 will include an SHG signal. The detector may be any of a photomultiplier tube, a CCD camera, a avalanche detector, a photodiode detector, a streak camera and a silicon detector. System 100 may also include one or more shutter-type devices 50. The type of shutter hardware used will depend on the timeframe over which the laser radiation is to be blocked, dumped or otherwise directed away from the sample site. An electro-optic blocking device such as a Pockel's Cell or Kerr Cell can be used to obtain very short blocking periods (i.e., with actuation times on the order of $10^{-9}$ to $10^{-12}$ seconds).

For longer blocking time intervals (e.g., from about $10^{-5}$ seconds and upwards) mechanical shutters or flywheel chopper type devices may be employed. However, electro-optic blocking devices will allow a wider range of materials to be tested in accordance with the methods below. A photon counting system 44 capable of discretely gating very small time intervals, typically, on the order of picoseconds to microseconds can be employed to resolve the time-dependent signal counts. For faster-yet time frames optical delay line(s) may be incorporated as noted above.

System 100 can include an additional electromagnetic radiation source 60 also referred to as a pump source. In various implementations, the radiation source 60 can be a laser illustrated as emitting a directed beam 62 or a UV flash lamp emitting a diverging or optically collimated pulse 64. In the case of a laser source, its beam 62 may be collinear with beam 12 (e.g., as directed by additional mirrors or prisms, etc.) Source 60 output wavelengths of light may be anywhere from about 80 nm and about 1000 nm. Using shorter wavelengths in this range (e.g. less than about 450 nm), is possible to drive charge excitation using fewer photons and/or with lower peak intensities than at longer wavelengths.

For a flash lamp, energy per flash or power level during flash may be substrate material dependent. A flashlamp producing a total energy of 1 J to 10 kJ per flash would be appropriate for fully depleted silicon-on-insulator (FD-SOI). However a pulsed or constant UV source would be viable as well. The important factor in the pump characteristics and use is that charge carriers are injected into the dielectric of the material to be interrogated. Manufacturers of suitable flash lamps include Hellma USA, Inc. and Hamamatsu Photonics K.K.

When a laser is employed as source 60, it may be any of a nanosecond, picosecond or femtosecond or faster pulse laser source. It may even be a continuous solid-state laser. In various embodiments, the pump source is tunable in wavelength. Commercially available options regarding lasers which are tunable include Spectra Physics' Velocity and Vortex Tunable Lasers. Additional tunable solid state solutions are available from LOTIS Ltd.'s LT-22xx series of solid state lasers.

Whether provided as a laser or a flash lamp, pump source 60 can be selected for relatively high average power. This could be from about 10 mW to about 10 W, but more typically from about 100 mW to about 4 W, depending on material to be interrogated (as, again, the consideration is ensuring that charge carrier mobility is induced in a way such that charge carriers are injected into the interface of the material (e.g., the dielectric interface), which can be material specific. The average power of the pump source 60 is selected to be below the optical damage threshold of the material. For example, pump source 60 can be selected to have an average optical power between 1-2 W when the interrogating material comprises silicon so as to not exceed the optical damage threshold for silicon.

Probe laser 10 may be any of a nanosecond, picosecond or femtosecond or faster pulse laser source. Two options that are currently commercially available lasers having the peak power, wavelength and reliability needed are doped fiber and Ti:Sapphire units. Coherent's VITESSE and Spectra Physics' MAI TAI lasers are examples of suitable Ti:Sapphire devices. Femtolasers Gmbh and others manufacture also manufacture other relevant Ti:Sapphire devices. Suitable doped fiber lasers are produced by IMRA, OneFive, and Toptica Photonics. Pico- and/or nano-second lasers from many manufacturers, such as Hamamatsu, may be options as well depending on the substrate material and pump type. Laser 10 may operate in a wavelength range between about 100 nm to about 2000 nm with a peak power between about 10 kW and 1 GW, but delivering power at an average below about 150 mW.

Various other optional so-called "intermediate" optical components may be employed in system 100. For example, the system may include a dichroic reflective or refractive filter 70 for selectively passing the SHG signal coaxial with reflected radiation directly from laser 10 and/or source 60. Alternatively, a prism may be employed to differentiate the weaker SHG signal from the many-orders-of-magnitude-stronger reflected primary beam. However, as the prism approach has proved to be very sensitive to misalignment, a dichroic system as referenced above may be preferred. Other options include the use of diffraction grating or a Pellicle beam splitter. An optical bundle 80 for focusing and collimating/columniation optics may be provided. Alternatively, a filter wheel 90, polarizer(s) 92 and/or zoom len(s) 94 units or assemblies may be employed in the system. Also, an angular (or arc-type) rotational adjustment (with corresponding adjustment for the detector) and in-line optical components may be desirable.

Figure 1C:
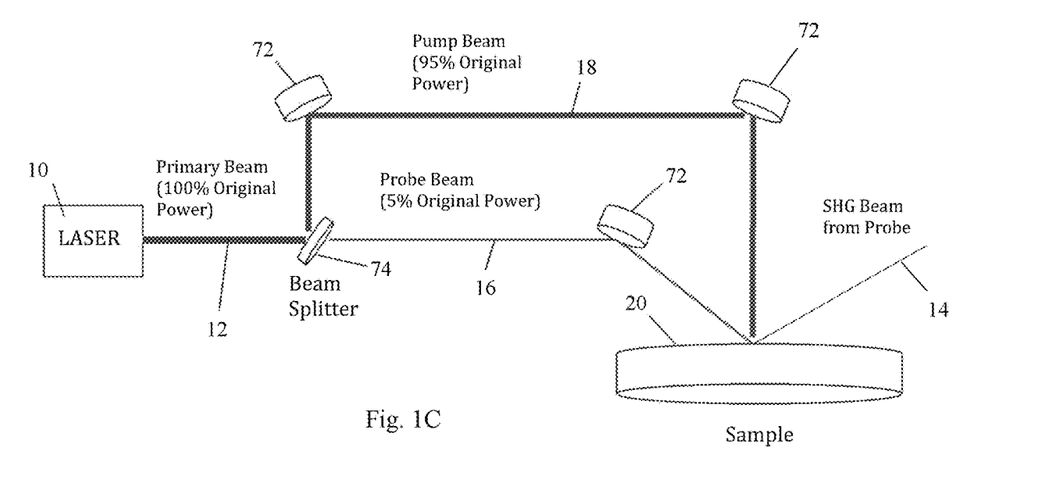
FIG. 1C is a diagram of another SHG metrology system embodiment hereof.

In the implementation illustrated in FIG. 1C, the beam 12 from the laser 10 can be split by a beam splitter 74 between two optical paths. The beam splitter 74 can split the beam 12 unequally between the two optical paths. For example, 70% of the energy of the beam 12 can be directed along a first optical path (e.g., as beam 16) and 30% of the energy of the beam 12 can be directed along a second optical path (e.g., as beam 18). As another example, 60% of the energy of the beam 12 can be directed along the first optical path and 40% of the energy of the beam 12 can be directed along the second optical path. As yet another example, 80% of the energy of the beam 12 can be directed along the first optical path and 20% of the energy of the beam 12 can be directed along the second optical path. The split may thus be unequal (e.g., 70-30%, 80-20%, 60-40% or any range therebetween, such as between 60-90% in one path and between 40-10% in another path as well as outside these ranges), sending a majority of the power in the pump beam, and a minority in the probe beam. For example, the split may be 60-70% and 40-30%, for the pump and probe, respectively, 70-80% versus 30-20% for the pump and probe, respectively, 80-90% versus 20-10%, for the pump and probe respectively, or 90-99.999% versus 10-0.001%, for the pump and probe respectively. In different embodiments, the probe beam could be between 0.001% to 49.99% while the pump beam could be between 50.001% and 99.999%, for example. The sum of the two beams may be 100% or approximate thereto. The split may be determined by the particular material system being characterized in some cases. In the example shown in FIG. 1C, 5% of the beam energy of the beam 12 is directed along the first optical path and 95% of the energy of the beam 12 is directed along the second optical path.

The beam splitter 74 can comprise a dielectric mirror, a splitter cube, a metal coated mirror, a pellicle mirror or a waveguide splitter. In implementations, where the beam 12 includes optical pulses, the beam splitter 74 can include an optical component having negligible dispersion that splits the beam 12 between two optical paths such that optical pulses are not broadened. As illustrated in FIG. 1C, each of the beams can be redirected or aimed using various mirror elements 2072.

The output from the detector 40 and/or the photon counting system 44 can be input to an electronic device 48. The electronic device 48 can be a computing device, a computer, a tablet, a microcontroller or a FPGA. The electronic device 48 includes a processor that may be configured to execute one or more software modules. In addition to executing an operating system, the processor may be configured to execute one or more software applications, including a web browser, a telephone application, an email program, or any other software application. The electronic device 48 can implement the methods discussed herein by executing instructions included in a machine-readable non-transitory storage medium, such as a RAM, ROM, EEPROM, etc. The electronic device 48 can include a display device and/or a graphic user interface to interact with a user. The electronic device 48 can communicate with one or more devices over a network interface. The network interface can include transmitters, receivers and/or transceivers that can communicate such as, for example, wired Ethernet, Bluetooth®, or wireless connections.

Regarding other options, since an SHG signal is weak compared to the reflected beam that produces it, it is desirable to improve the signal-to-noise ratio of SHG counts. As photon counting gate times for the photon counting system 44 decrease for the blocking and/or delay processes described herein, improvement becomes even more important. One method of reducing noise that may be employed is to actively cool the photon counter. This can be done using cryogenic fluids such as liquid nitrogen or helium or solid state cooling through use of a Peltier device. Others areas of improvement may include use of a Marx Bank Circuit (MBC) as relevant to shutter speed. Moreover, system 100 may be incorporated in-line within a production line environment. Production line elements preceding or following system 100 may include any of epitaxial growth system, lithography and/or deposition (CVD, PVD, sputtering, etc.) systems.

Figure 2A:
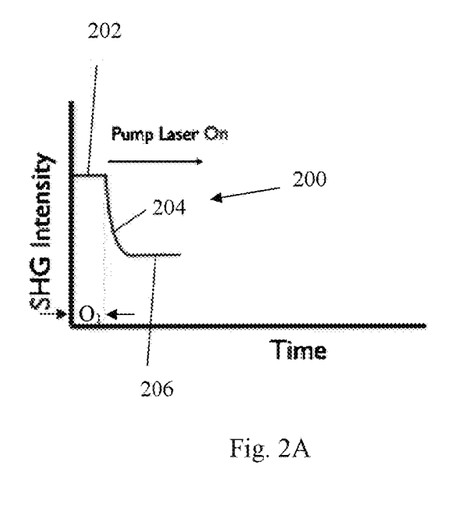
FIGS. 2A/2B and 3A/3B are diagrams illustrating example pump/probe system uses for producing characteristic SHG signals.
Figure 2B:
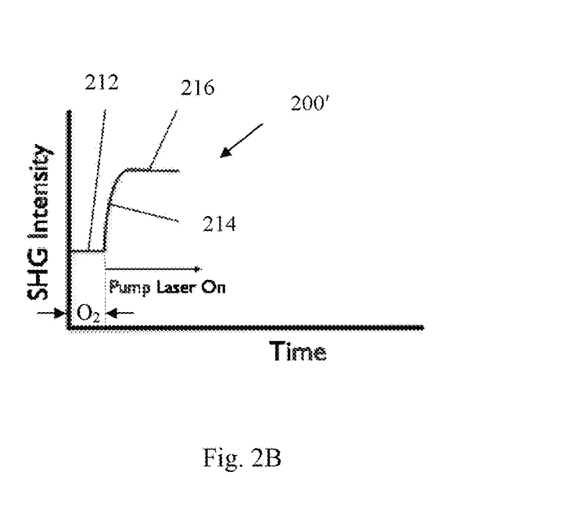

Turning now to FIGS. 2A/2B and 3A/3B, these are schematic diagrams illustrating example types of SHG curves that may be produced with the subject pump/probe system in their methods of use. In FIGS. 2A and 2B, the timescale to obtain such signals in on the order of milliseconds ($10^{-3}$ s). Thus, these are "fast" processes. As further discussed below, they may offer several orders of magnitude of time-wise improvement relative to existing approaches. For example, a flash lamp capable of exposing the entire surface of a test material to UV radiation prior to SHG probing drastically reduces the overall scan time since sustained measurements at each point may not be required.

Specifically, in FIG. 2A an SHG signal 200 is measured with an initial intensity 202. This signal is produced by the probe source radiation applied at a surface location. Upon adding pump source radiation (to that of the probe which stays on) after a given temporal offset ($O_1$), the signal intensity drops along a time-dependent curve 204 to a lower level 206. Conversely, in FIG. 2B SHG signal 200' at a lower level 212 produced by probe radiation alone increases along a time-dependent curve 214 to a higher plateau 216 upon applying pump radiation after a time offset ($O_2$). Signals 200 and 200' also include a time-independent component or portion at the beginning and end of the curves.

Both observations in FIGS. 2A and 2B may be made with the subject system depending on substrate material and different laser powers (e.g., in this case, that of the pump). In various embodiments charge separation comprise electrons and holes separating from each other after excitation from a photon. Electrons injected into the $SiO_2$ conduction band from the silicon valence band by the photons from the laser are trapped primarily on the top surface of the oxide. The holes congregate mostly in the silicon valence band close to the $Si/SiO_2$ interface. This separation of charge carriers due to excitation from the incident radiation or from internal photoemission contributes to the electric field(s) present inside the subject system, which in turn changes the SHG measured. Various factors, such as the presence of gaseous Oxygen at the testing site, as well as the composition and structure of the sample in question, will determine whether the observation is made as in FIG. 2A or 2B.

Indeed, a combination of signals 200 and 200' has been observed in some instances. In those instances, the signal intensity first dropped from a peak, bottomed out, and then rose to an asymptote again. Generally, the SHG intensity curves are determined by the non-linear susceptibility tensor, which is in turn affected by molecular orientation, atomic organization, electronic structure and external fields. Charge carriers moving across the interface will change the charge state in the structure and the electric field in the sub-interfacial layer where the SHG signal generation occurs. Depending on the type (positive or negative) of charge carriers crossing the interface, and the initial state of the field across the interface, different time-dependent curves will be observed. The intensity of the detected SHG signal can depend on various factors including spot size, average laser power, and peak laser power. In various implementations, the system 100 can be configured to detect SHG signal having an intensity in a range between about 400 counts/second and about 7 million counts/second. The pump/probe system described herein can reduce the time required for the charge carriers moving across the interface to reach a saturation level. In various embodiments, the time required for the charge carriers moving across the interface to reach a saturation level can between 1 millisecond and 1000 seconds in the pump/probe system described herein. Since it may be advantageous to obtain the time evolution of the SHG signal when the charge carrier density in the region including interface is below saturation as well as when the charge carrier density in the region including interface reaches saturation level, the system can be configured to obtain SHG signal measurements within about 1 microsecond after turning on/turning off the pump radiation. For example, the system can be configured to obtain SHG signal measurements within 10 seconds after turning on/turning off the pump radiation (or probe radiation), within about 6 seconds after turning on/turning off the pump radiation (or probe radiation), within about 1 second after turning on/turning off the pump radiation (or probe radiation), within about 100 milliseconds after turning on/turning off the pump radiation (or probe radiation) or within about 1 millisecond after turning on/turning off the pump radiation (or probe radiation), within 1 microsecond after turning on/turning off the pump radiation (or probe radiation), within 1 nanosecond after turning on/turning off the pump radiation (or probe radiation) or in any range formed by any of these values (for example, for time periods greater than a nanosecond, greater than a microsecond, greater than a millisecond, etc.) as well as outside any of those ranges. These values and ranges apply for obtaining data obtained from a single point, but with proper imaging optics, could be increased to substantial areas of the wafer, up to and including the entire wafer at once. As indicated by the parentheticals above, these values and ranges also apply to the probe radiation. Reducing the charging time and the time required to obtain the SHG signal can allow for faster testing of interfaces and thus increase through-put of testing and/or manufacturing production lines.

Figure 3A:
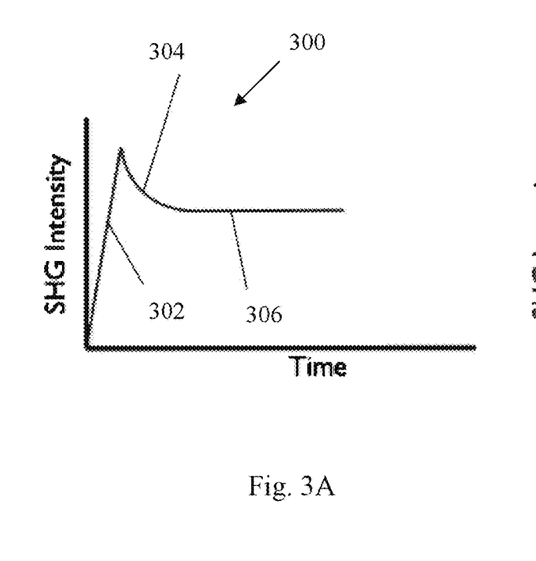
Figure 3B:
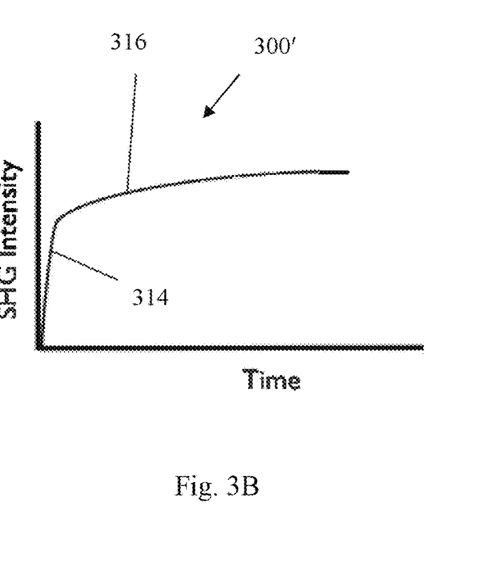

By way of comparison, FIGS. 3A and 3B schematically illustrate SHG signal curves 300 and 300' for corresponding materials in which only one radiation source is used (in this case a high average power and high peak power laser) to interrogate the substrate as in existing SHG techniques. The time scale for generating signals 300 and 300 in FIGS. 3A and 3B is on the order of tens-to hundreds ($10^2$ s) seconds.

Over such time, these signals (like the signals in FIGS. 2A and 2B) include lower and upper plateaus 306, 316 that can be characterized after initial 302 and/or time-dependent signals. Thus, while similar (or identical) analysis may be performed with the signals 200/200' and 300/300', the main difference is that with the subject systems (i.e., using a lower peak power femto-second probe laser in conjunction with a higher average power pump for material pre-excitation) allows for vastly improved time-wise efficiency in obtaining the requisite signal information. Moreover, the subject approach provides a way to more easily determining time-independent SHG measurements without the use of a filter-wheel or some other method.

Figure 4:
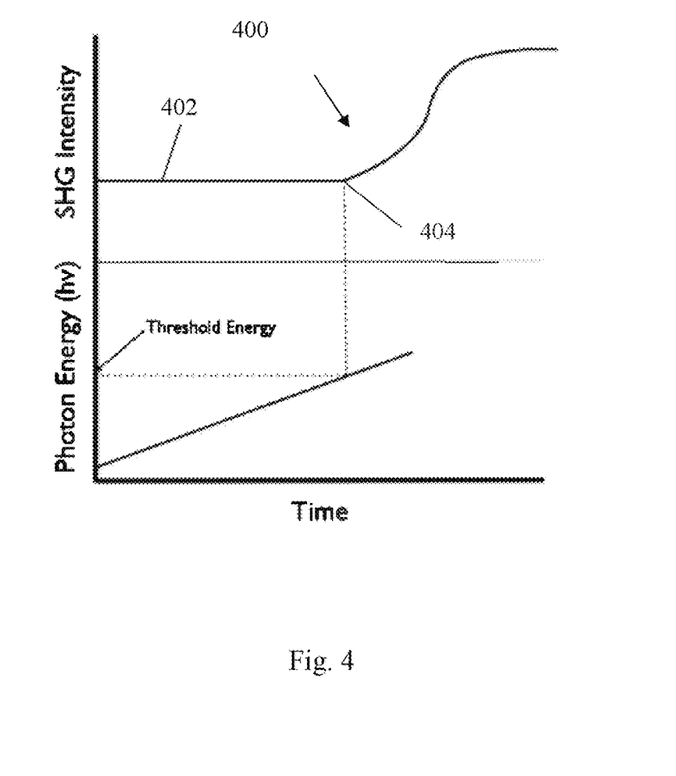
FIG. 4 is a diagram illustrating probe/pump system use to determine threshold injection carrier energy.

In any case, FIG. 4 illustrates a method for determining threshold injection carrier energy. In this case, the pump comprises a tunable wavelength laser. This allows ramp-up of the output frequency (and hence energy by E=hν) of the photons over time from the pump incident on the sample. The observed SHG activity action is illustrated as signal 400. With the pump laser so-applied or engaged, an initial SHG signal level 402 generated by application of a probe laser is observed to the point the signal suddenly changes (i.e., producing an inflection, discontinuity, maximum, minimum, step function, cusp, or sudden change in slope of sorts at 404). The frequency at this point is taken to correspond to the threshold energy. In various implementations, the threshold energy is the energy required to transport electrons from the valence band of one semiconductor material to the conduction band of another semiconductor material across an interface between two materials such as two semiconductor materials or a semiconductor material and a dielectric material (e.g., Si and $SiO_2$, Si and $Si_3N_4$, Si and $Ta_2O_5$, Si and $BaTiO_3$, Si and $BaZrO_3$, Si and $ZrO_2$, Si and $HfO_2$, Si and $La_2O_3$, Si an $Al_2O_3$, Si and $Y_2O_3$, Si and $ZrSiO_4$). The system 100 can be configured to measure threshold energy in the range between about 1.0 eV and about 6.0 eV. The systems and methods described herein can be configured to determine threshold energy for a variety of interfaces such as for example, between two different semiconductors, between a semiconductor and a metal, between a semiconductor and a dielectric, etc.

Figure 5:
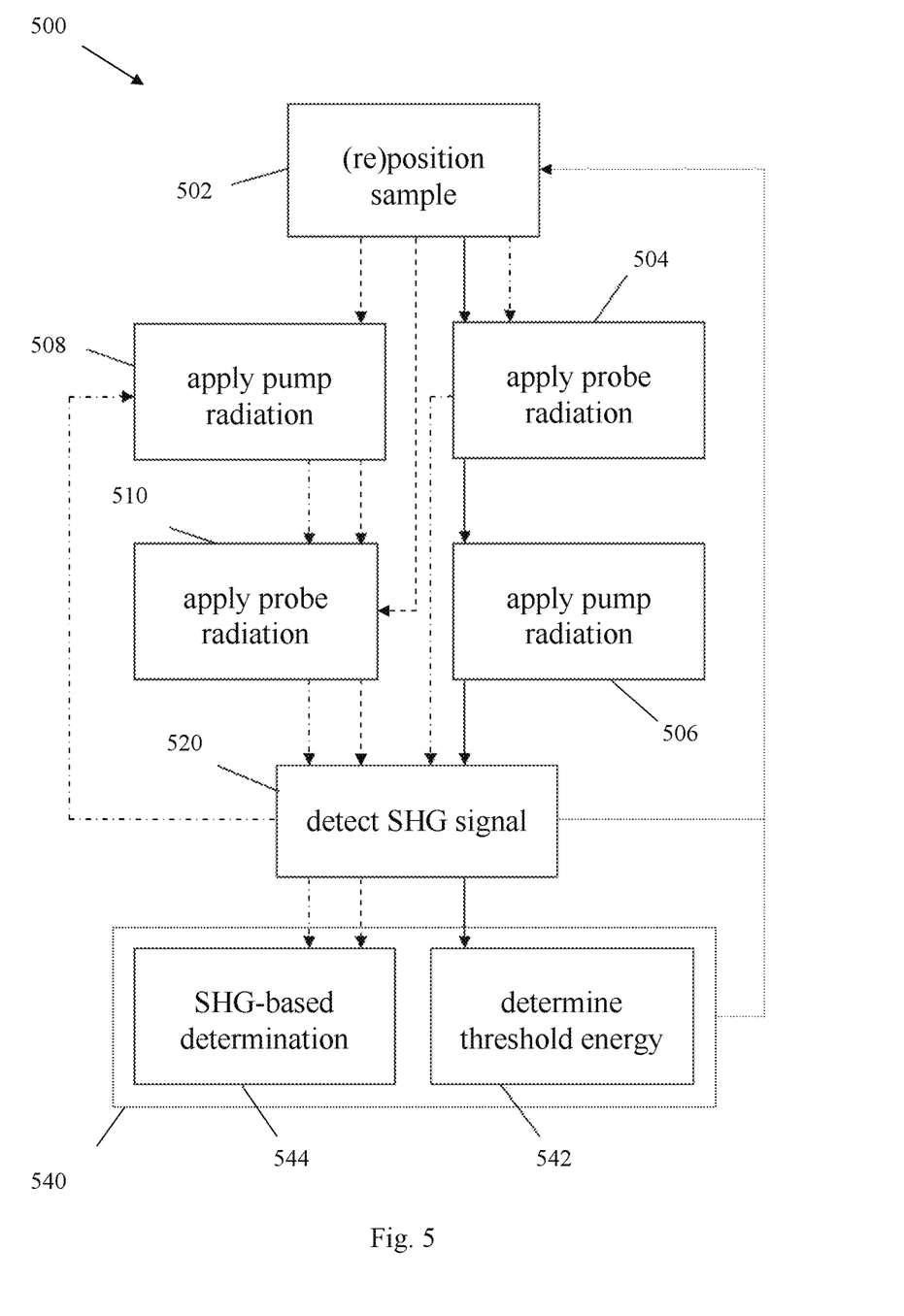
FIG. 5 is a flowchart detailing methods to produce signals as presented in the diagrams.

FIG. 5 is a flowchart 500 illustrating an implementation of a method for characterizing semiconductor devices with SHG. Various process flowpaths are indicated. Any such methods may begin at 502 with positioning a sample at a desired location (e.g., typically by locating chuck 30 after a wafer 20 has been secured thereto). Progressive positioning (i.e., re-positioning) may occur after any given SHG detection event 520 as further described for scanning multiple surface positions or even every surface position in a region of the sample or even every surface position of the sample. Alternatively, such action may occur after a given determination at 540 is made concerning a detected SHG signal (either "return" option indicated by dotted line). Further details regarding alternative determinations may be appreciated in reference to the other portions of this application referenced above. In any case, following sample positioning or re-positioning, a given flowpath is selected (or another flowpath may be run at the same surface position after in sequence to generate different data).

Following a one process flowpath (solid lines, in part), at 504 probe source radiation is applied to the sample surface at a given location. Next, at 506 pump source radiation is applied. In this example, the pump radiation is applied in a varying manner that (optionally) increases photon energy linearly by decreasing the radiation wavelength. The resulting SHG is detected at 520. At 542 signal analysis (per the example in FIG. 4) allows for carrier injection threshold energy to be determined. In various implementations, the energy of the pump radiation can correspond to the threshold energy of the semiconductor interface. Accordingly, the energy of the pump radiation can be between about 1.0 eV and about 6.0 eV. For example, to determine the threshold energy across a Si and $SiO_2$ interface, the threshold energy of the pump radiation can vary between about 4.1 eV and about 5.7 eV. Variation in the energy of the pump radiation can be accomplished by varying the frequency (or wavelength) of the radiation. For example, to interrogate a sample with an expected value of the threshold energy around 3.2 eV, the wavelength of the pump radiation can be varied between about 443 nm and about 365 nm. In various implementations, the energy of the pump radiation can be below the threshold energy of the semiconductor interface since the photons from the pump radiation can generate electrons with twice energy (e.g., when a single electron absorbs two photons). In such implementations, the charging time is increased which may provide observation with increases resolution and intensity. Increasing the charging time can also increase the time required to test a sample site which can reduce throughput.

Following another flowpath (dashed lines, in part), at 508 pump radiation is applied to the substrate. Such application may be directed only at the surface (e.g., by a laser) to be immediately interrogated or the entire surface of the wafer (e.g., using a flash lamp). Next, at 510 the section of the sample to be interrogated is exposed to probe source radiation. The resulting SHG is detected at 520. The pump-probe-detect aspects of the method may then repeat potentially after sample repositioning at 502. As indicated, however, action box 508 may be skipped and pumping again may be avoided or omitted from a sequential scanning process, as in the example above where the whole substrate was initially exposed to pump radiation. In any case, at 544 any of a variety of SHG-based signal analysis may be conducted to make a determination other than for threshold energy as in block 542 as discussed elsewhere in this patent application.

Following another process flow path (dash-and-dot/centerline lines, in part) probe interrogation is performed at 504 and 510 before and after pump radiation is applied at 508 with SHG signal data collection at 520 directly after probe radiation application at 504 and 510. Again, this method may be done recursively to sample a plurality of sites such as every section of a substrate or a region thereof, returning to flowchart element 502 for repositioning and the probe-detect-pump-probe-detect method or sub-method repeated.

Notably, any of the SHG signal analysis methods or sub-methods (generically embraced in box 540 and 542) can be performed in real-time, as in instantaneous or near-instantaneous output. In doing so, any of the spectrographic properties determined by the data gathered can be computed by a software package either by integrated software on the machine or remotely. Alternatively, SHG signal analysis may be handled in post-processing after some or all of the SHG data has been detected or collected.

The systems and methods described herein can be used to characterize a sample (e.g., a semiconductor wafer or a portion thereof). For example, the systems and methods described herein can be used to detect defects or contaminants in the sample as discussed above. The systems and methods described herein can be configured to characterize the sample during fabrication or production of the semiconductor wafer. Thus, the systems and methods can be used along a semiconductor fabrication line in a semiconductor fabrication facility. The systems and methods described herein can be integrated with the semiconductor fabrication/production line. The systems and methods described herein can be integrated into a semiconductor fab line with automated wafer handling capabilities. For example, the system can be equipped with an attached Equipment Front End Module (EFEM), which accepts wafer cassettes such as a Front Opening Unified Pod (FOUP). Each of these cassettes can be delivered to the machine by human operators or by automated cassette-handling robots which move cassettes from process to process along fabrication/production line.

In various embodiments, the system can be configured such that once the cassettes are mounted on the EFEM, the FOUP is opened, and a robotic arm selects individual wafers from the FOUP and moves them through an automatically actuated door included in the system, into a light-tight process box, and onto a bias-capable vacuum chuck. The chuck may be designed to fit complementary with the robotic arm so that it may lay the sample on top. At some point in this process, the wafer can be held over a scanner for identification of its unique laser mark.

Accordingly, a system configured to be integrated in a semiconductor fabrication/assembly line can have automated wafer handling capability from the FOUP or other type of cassette; integration with an EFEM as discussed above, a chuck designed in a way to be compatible with robotic handling, automated light-tight doors which open and close to allow movement of the robotic wand/arm and software signaling to EFEM for wafer loading/unloading and wafer identification.

As described above each of Sections I, II, III, and IV of U.S. Provisional Application No. 61/980,860, filed on Apr. 17, 2014, titled "WAFER METROLOGY TECHNOLOGIES," are incorporated herein by reference in their entirety. Similarly, co-pending patent applications (i) U.S. patent application Ser. No. 14/690,256, filed Apr. 17, 2015 titled "CHARGE DECAY MEASUREMENT SYSTEMS AND METHODS", published as U.S. Publication No. 2015/0331029, and (ii) U.S. patent application Ser. No. 14/690,251, filed Apr. 17, 2015 titled "FIELD-BIASED SECOND HARMONIC GENERATION METROLOGY", published as U.S. Publication No. 2015/0331036, are each incorporated herein by reference in their entirety. Accordingly, features from the disclosure of any of these documents incorporated by reference may be combined with any features recited elsewhere herein.

Variations

Example invention embodiments, together with details regarding a selection of features have been set forth above. As for other details, these may be appreciated in connection with the above-referenced patents and publications as well as is generally known or appreciated by those with skill in the art. The same may hold true with respect to method-based aspects of the invention in terms of additional acts as commonly or logically employed. Regarding such methods, including methods of manufacture and use, these may be carried out in any order of the events which is logically possible, as well as any recited order of events. Furthermore, where a range of values is provided, it is understood that every intervening value, between the upper and lower limit of that range and any other stated or intervening value in the stated range is encompassed within the invention. Also, it is contemplated that any optional feature of the inventive variations described may be set forth and claimed independently, or in combination with any one or more of the features described herein.

As used herein, a phrase referring to "at least one of" a list of items refers to any combination of those items, including single members. As an example, "at least one of: a, b, or c" is intended to cover: a, b, c, a-b, a-c, b-c, and a-b-c.

Though the invention embodiments have been described in reference to several examples, optionally incorporating various features, they are not to be limited to that which is described or indicated as contemplated with respect to each such variation. Changes may be made to any such invention embodiment described and equivalents (whether recited herein or not included for the sake of some brevity) may be substituted without departing from the true spirit and scope hereof. Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a subcombination or variation of a subcombination.

The various illustrative processes described may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, DisplayPort, or any other form.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more example embodiments, the functions described may be implemented in hardware, software, firmware, or any combination thereof. If implemented in software, the functions may be stored on, transmitted over or resulting analysis/calculation data output as one or more instructions, code or other information on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. The memory storage can also be rotating magnetic hard disk drives, optical disk drives, or flash memory based storage drives or other such solid state, magnetic, or optical storage devices.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Operations as described herein can be carried out on or over a website. The website can be operated on a server computer, or operated locally, e.g., by being downloaded to the client computer, or operated via a server farm. The web site can be accessed over a mobile phone or a PDA, or on any other client. The website can use HTML code in any form, e.g., MHTML, or XML, and via any form such as cascading style sheets ("CSS") or other.

Also, the inventors hereof intend that only those claims which use the words "means for" are to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

It is also noted that all features, elements, components, functions, acts and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and acts or steps from different embodiments, or that substitute features, elements, components, functions, and acts or steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

In some instances entities are described herein as being coupled to other entities. It should be understood that the terms "interfit", "coupled" or "connected" (or any of these forms) may be used interchangeably herein and are generic to the direct coupling of two entities (without any non-negligible, e.g., parasitic, intervening entities) and the indirect coupling of two entities (with one or more non-negligible intervening entities). Where entities are shown as being directly coupled together, or described as coupled together without description of any intervening entity, it should be understood that those entities can be indirectly coupled together as well unless the context clearly dictates otherwise.

Reference to a singular item includes the possibility that there are a plurality of the same items present. More specifically, as used herein and in the appended claims, the singular forms "a," "an," "said," and "the" include plural referents unless specifically stated otherwise. In other words, use of the articles allow for "at least one" of the subject item in the description above as well as the claims below.

It is further noted that the claims may be drafted to exclude any optional element (e.g., elements designated as such by description herein a "typical," that "can" or "may" be used, etc.). Accordingly, this statement is intended to serve as antecedent basis for use of such exclusive terminology as "solely," "only" and the like in connection with the recitation of claim elements, or other use of a "negative" claim limitation language. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Yet, it is contemplated that any such "comprising" term in the claims may be amended to exclusive-type "consisting" language. Also, except as specifically defined herein, all technical and scientific terms used herein are to be given as broad a commonly understood meaning to those skilled in the art as possible while maintaining claim validity.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, acts, steps, or elements of the embodiments may be recited in or added to the claims, as well as negative limitations (as referenced above, or otherwise) that define the inventive scope of the claims by features, functions, steps, or elements that are not within that scope. Thus, the breadth of the inventive variations or invention embodiments are not to be limited to the examples provided, but only by the scope of the following claim language. That being said, we claim:

The invention claimed is:

1. A method of optical interrogation comprising:
   applying pumping radiation across an entire semiconductor wafer using a pump optical source;
   providing probing radiation to a first location on the wafer using a probe optical source;
   raster scanning the probing radiation or the wafer;
   providing probing radiation to a second location on the wafer using the probe optical source;
   detecting a Second Harmonic Generation (SHG) effect signal at the first and second locations generated by at least one of the pumping radiation and the probing radiation using an optical detector; and
   a) obtaining the SHG effect signal less than 10 seconds after applying at least one of the pumping radiation and the probing radiation at the first or second locations or
   b) varying a wavelength of the pumping radiation to detect a region wherein the SHG effect signal suddenly changes in slope to determine a threshold injection carrier energy.

2. The method of claim 1, further comprising applying the pumping radiation and the probing radiation with a variable time offset relative to one another to enable determination of one or more material parameters, the variable time offset being associated with energy of at least one of the probing radiation or the pumping radiation.

3. The method of claim 1, comprising: a) obtaining the SHG effect signal within less than 10 seconds after applying at least one of:
   the pumping radiation and the probing radiation, and b) applying the pumping and probing radiation with a variable time offset relative to one another to enable determination of material parameters not otherwise attainable with application of probing radiation only or pumping and probing radiation without the variable time offset.

4. The method of claim 1, comprising: a) obtaining the SHG effect signal within less than 10 seconds after applying at least one of the pumping radiation and the probing radiation, b) applying the pumping and probing radiation with a variable time offset relative to one another to enable determination of material parameters, and c) varying a wavelength of the pumping radiation to detect a region wherein the SHG effect signal suddenly changes in slope to determine threshold injection carrier energy.

5. The method of claim 1, comprising: a) obtaining the SHG effect signal within less than 10 seconds after applying at least one of:
   the pumping radiation and the probing radiation and b) varying a wavelength of the pumping radiation to detect a region wherein the SHG effect signal suddenly changes in slope to determine threshold injection carrier energy.

6. The method of claim 1, comprising: a) applying the pumping and probing radiation with a variable time offset relative to one another to enable determination of material parameters, and b) varying a wavelength of the pumping radiation to detect a region wherein the SHG effect signal suddenly changes in slope to determine threshold injection carrier energy.

7. The method of any of claims 1, wherein the SHG effect signal is obtained in less than 6 seconds after applying at least one of the pumping radiation and the probing radiation.

8. The method of any of claims 1, wherein the SHG effect signal is obtained in less than 1 second after applying at least one of the pumping radiation and the probing radiation.

9. The method of any of claims 1, wherein the SHG effect signal is obtained in less than 10 nanoseconds after applying at least one of the pumping radiation and the probing radiation.

10. The method of claim 1, wherein the pumping radiation has an average optical power greater than about 100 mW.

11. The method of claim 1, wherein the pumping radiation has an average optical power less than about 10 W.

12. The method of claim 1, wherein the pumping radiation has a wavelength between about 80 nm and about 1000 nm.

13. The method of claim 1, wherein the probing radiation has an average optical power less than about 150 mW.

14. The method of claim 1, wherein the probing radiation has a peak optical power greater than about 10 kW.

15. The method of claim 1, wherein the probing radiation has a peak optical power less than about 1 GW.

16. The method of claim 1, wherein the probing radiation has a wavelength between about 100 nm to 2000 nm.

17. The method of claim 1, wherein the pump optical source comprises a UV flash lamp.

18. The method of claim 1, wherein the pump optical source comprises a pulsed laser.

19. The method of claim 1, wherein the SHG effect signal is obtained less than 10 seconds after applying at least one of the pumping radiation and the probing radiation.

20. The method of claim 1, wherein the wavelength of the pumping radiation is varied to detect a region wherein the SHG effect signal suddenly changes in slope to the threshold injection carrier energy.

21. A method of optical interrogation comprising:
    applying pumping radiation from a pump optical source across an entire semiconductor wafer;
    applying probing radiation from a probing optical source to a first location on the wafer;
    raster scanning the probing radiation or the wafer;
    applying probing radiation from the probing optical source to a second location on the wafer;
    detecting a Second Harmonic Generation (SHG) effect signal generated by at least one of the pumping radiation and the probing radiation at the first and second locations using an optical detector;
    varying a wavelength of the pumping radiation; and
    determining a characteristic of the detected Second Harmonic Generation (SHG) effect signal in the presence of at least one of the pumping and probing radiation.

22. A method of optical interrogation comprising:
    applying pumping radiation energy from a pump optical source across an entire semiconductor wafer;
    applying probing radiation energy from a probing optical source to a first location on the wafer;
    raster scanning the probing radiation energy or the wafer;
    applying probing radiation energy from the probing optical source to a second location on the wafer;
    detecting a Second Harmonic Generation (SHG) effect signal at the first and second locations using an optical detector;
    varying energy of the pump radiation; and
    identifying an inflection point in the SHG effect signal associated with a threshold injection carrier energy.

* * * * *